(12) United States Patent
Murata et al.

(10) Patent No.: US 7,683,817 B2
(45) Date of Patent: Mar. 23, 2010

(54) SOLID-STATE IMAGING DEVICE, AD CONVERTER, AND AD CONVERTING METHOD

(75) Inventors: Takahiko Murata, Osaka (JP);
Shigetaka Kasuga, Osaka (JP);
Takayoshi Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/104,128

(22) Filed: Apr. 16, 2008

(65) Prior Publication Data
US 2008/0266159 A1 Oct. 30, 2008

(30) Foreign Application Priority Data
Apr. 26, 2007 (JP) .............................. 2007-117647

(51) Int. Cl.
*H03M 1/34* (2006.01)
(52) U.S. Cl. ...................................... 341/158; 341/155
(58) Field of Classification Search .......... 341/140–160
See application file for complete search history.

(56) References Cited

U.S. PATENT DOCUMENTS

| | | | | |
|---|---|---|---|---|
| 5,736,953 A | * | 4/1998 | Yamaguchi | 341/164 |
| 5,877,715 A | * | 3/1999 | Gowda et al. | 341/122 |
| 5,920,274 A | * | 7/1999 | Gowda et al. | 341/155 |
| 2005/0206548 A1 | | 9/2005 | Muramatsu et al. | |
| 2008/0018770 A1 | | 1/2008 | Kato | |
| 2008/0024638 A1 | | 1/2008 | Murakami | |
| 2008/0061216 A1 | | 3/2008 | Kasuga et al. | |
| 2008/0074527 A1 | | 3/2008 | Kato | |
| 2008/0079106 A1 | | 4/2008 | Miyagawa et al. | |

FOREIGN PATENT DOCUMENTS

JP  2005-323331  11/2005

OTHER PUBLICATIONS

English language Abstract of JP 2005-323331.

* cited by examiner

*Primary Examiner*—Lam T Mai
(74) *Attorney, Agent, or Firm*—Greenblum & Bernstein PLC

(57) ABSTRACT

The present invention provides a solid-state imaging device which can output a digital signal at a high speed without using a high-speed clock. The solid-state imaging device includes light receiving elements provided in an array and generating signal voltages based on light intensity of received light and AD converters each of which is provided in each of columns in the array. Each of the AD converters includes: a reference voltage generating unit (10) generating reference voltages; comparators (11a through 11c) comparing in parallel a current signal voltage which is one of signal voltages generated by the light receiving elements in the respective matrix columns with the reference voltages generated by the reference voltage generating unit; a digital signal generating circuit (23) generating a digital signal showing a result of the comparison and outputting the digital signal out of the AD converter.

9 Claims, 10 Drawing Sheets

US 7,683,817 B2

SOLID-STATE IMAGING DEVICE, AD CONVERTER, AND AD CONVERTING METHOD

BACKGROUND OF THE INVENTION (1) Field of the Invention

The present invention relates to a solid-state imaging device, and to a technique for digitally outputting a light receiving signal obtained with photo electrical conversion in a solid-state imaging device.

(2) Description of the Related Art

Recently, a rapid increase in the number of pixels in a solid-state imaging device has required the signals to be read-out at a high speed from a solid state imaging device.

An early solid-state imaging device is structured to obtain a digital signal from an external AD (analog-digital) conversion unit by reading-out an analog signal, out of the solid-state imaging device, obtained as a result of photo electrical conversion in a pixel circuit. This structure has reached to a limit of improving the read-out speed due to an internal stray capacity in the solid-state imaging device.

In order to solve this problem, there is a well-known technique for achieving a high-speed signal output by converting the analog signal obtained from the pixel circuit into the digital signal in the solid-state imaging device so that an influence such as the stray capacity can be curbed (See Patent reference 1: Japanese Unexamined Patent Application Publication No. 2005-323331, for example).

FIG. 1 is a schematic view showing a structure of an essential part of the solid-state imaging device disclosed in Patent reference 1. This solid-state imaging device converts a signal voltage obtained from a pixel circuit 92 into a digital signal through integrating type AD conversion. An outline of the operations of this solid-state imaging device shall be described.

The pixel circuit 92 in an imaging unit 91 applies the signal voltage obtained through photo electrical conversion to one end of the input terminal in a voltage comparing unit 93. A reference signal generating unit 95 generates: a staircase ramp wave RAMP descending in synchronism with a clock signal CK sent from a controlling unit 94, using, for example, a DA (digital-analog) conversion unit; and applies to another end of the input terminal in the voltage comparing unit 93.

A counter unit 96 dynamically starts counting the clock signal CK when the ramp wave RAMP starts descending. When a signal, indicating that a level of the ramp wave RAMP coincides with the signal voltage from the pixel circuit 92, is sent from the voltage comparing unit 93, a count value at the moment is outputted as the digital signal indicating the signal voltage from the pixel circuit 92.

SUMMARY OF THE INVENTION

According to a conventional technique, however, a timing indicating the level of the ramp wave RAMP coincides with the signal voltage from the pixel circuit 92 is required to be determined in a short period of time for obtaining the high-speed digital signal. Thus, the ramp wave RAMP should be swept at a high speed, using a high-speed (in other words, high-frequency) clock signal CK.

For example, a clock signal CK having 410 MHz in frequency is required in order to obtain a digital output having 12 bits in resolution within 10 µs. Furthermore, a clock signal CK having 1.6 GHz in frequency is required in order to obtain a digital output having 14 bits in resolution.

Since it is technically challenging to implement a stably operating circuit at the aforementioned high-speed clocks, the conventional technique has had a difficulty in putting a solid-state imaging device achieving both a high resolution of the digital output and a high-speed output into practical use.

In view of the above-mentioned problems, the present invention is produced in order to provide a solid-state imaging device and an AD converter which allow a high-speed digital output without a high-speed clock (in other words a high frequency).

In order to achieve the above objectives, a solid-state imaging device of the present invention includes: plural light receiving elements provided in a matrix each of which generates a signal voltage based on an intensity of received light; and plural AD converters each of which is provided on a corresponding column of the matrix, wherein each of the plural AD converters includes: a reference voltage generator which generates plural reference voltages; plural comparators which compare in parallel a current signal voltage with the plural the reference voltages generated by the reference voltage generator, the current signal voltage being one of the signal voltages generated by the plural light receiving elements in the corresponding column; and an outputting circuit which outputs a digital signal showing a result of the comparison.

In this structure, a time to obtain the digital signal is determined by an operation speed of the plural comparators. Since an operation speed of a comparator is fast in general, and the plural comparators compare in parallel the current signal voltage with the plural reference signals, the digital signal can be outputted at a high speed without using a high-speed clock.

Moreover, each of the plural AD converters may further include a selector which selects neighboring two of the reference voltages shown, by a result of the comparison, as including the current signal voltage in between. The plural comparators may compare in parallel the current signal voltage with plural new reference voltages included between the two reference voltages selected by the selector. The outputting circuit may output a new digital signal showing a result of a comparison between the current signal voltage and the plural new reference voltages.

In this structure, a digital signal having a high resolution (having a larger number of bits) can be obtained at a high speed since a new digital signal can be outputted, narrowing a comparison range in stages.

Furthermore, the reference voltage generator may generate plural reference voltages included between two applied voltages when the two applied voltages are applied out of the reference voltage generator. Each of the plural of AD converters may further include a sample-hold circuit which holds the reference voltages selected by the selector and applies the held reference voltages to the reference voltage generator. The reference voltage generator may generate plural new reference voltages included between the applied reference voltages as the plural new reference voltages when the reference voltages held in the sample-hold circuit are applied.

This structure allows a small-scale circuit to obtain a digital signal having a high resolution since a new digital signal can be outputted, narrowing a comparison range in stages, through sequential processing for which the reference voltage generator and the plural comparators are repeatedly used.

In addition, each of the plural AD converters may further include: an other reference voltage generator generates plural reference voltages included between applied reference voltages as the plural new reference voltages when the reference voltages selected by the selector are applied, the other reference voltage generator being different from the reference voltage generator; and plural other comparators which compare in parallel the current signal voltage when the new plural reference voltages are generated by the other reference voltage generator, the plural other comparators being different from the comparators.

In this structure, a new digital signal having a high resolution can be obtained in a short period of time as short as a propagation delay time throughout the circuit since multistage processing, using a single reference voltage generator and plural comparators per comparison range, can output a new digital signal, narrowing the comparison range in stages.

Moreover, the present invention can be implemented not only as a solid-state imaging device, but also as an AD compiler and as an AD compiling method.

The present invention allows a high-speed output of the digital signal without using a high-speed clock by obtaining a digital signal to be outputted, comparing in parallel an analog signal obtained through photo electrical conversion with plural reference voltages, in a solid-state imaging device for outputting a result of the photo electrical conversion in a digital signal.

FURTHER INFORMATION ABOUT TECHNICAL BACKGROUND TO THIS APPLICATION

The disclosure of Japanese Patent Application No. 2007-117647 filed on Apr. 26, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiments of the present invention shall be described with reference to the drawings, as follows.

First Embodiment

A solid-state imaging device in a first embodiment of the present invention shall be described with reference to FIGS. 2 to 5.

Figure 1:
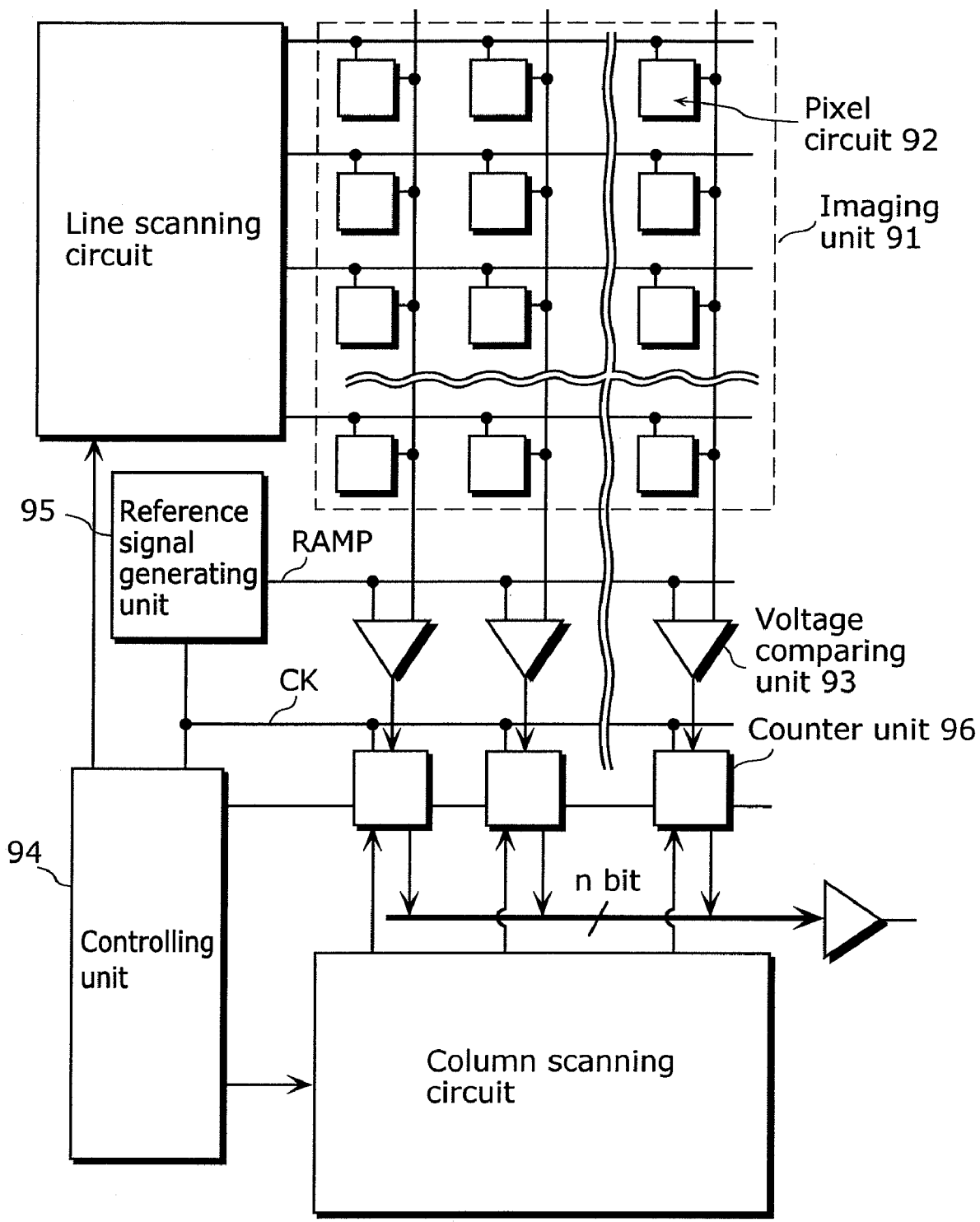
FIG. 1 is a schematic view showing a structure of an essential part of a conventional solid-state imaging device.
Figure 2:
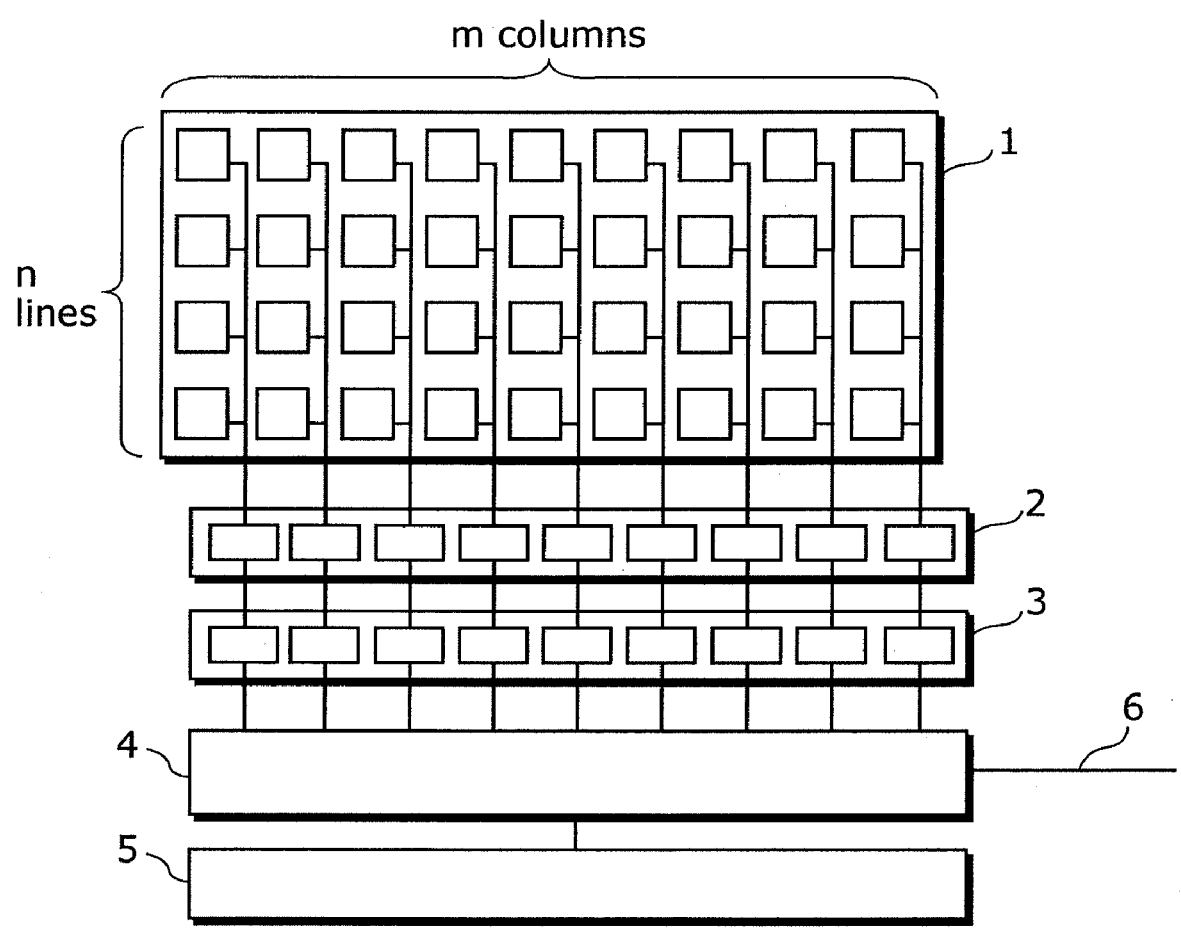
FIG. 2 is a block diagram showing one example of a functional structure of a solid-state imaging device in a first embodiment.

FIG. 2 is a block diagram showing one example of a functional structure of the solid-state imaging device in the first embodiment.

The solid-state imaging device in FIG. 2, including a pixel unit 1, a holding unit 2, an AD converting unit 3, a common channel signal line 4, a timing generator 5, and an external output line 6: AD-converts an analog signal obtained with photo electrical conversion performed by a light receiving element; and outputs a digital signal showing the result of the AD conversion.

The pixel unit 1 is provided in an n-line m-column array and has light receiving elements including the light receiving element generating a signal voltage according to light intensity of received light.

The holding unit 2 includes a sample-hold circuit per column. Each of sample-hold circuits is connected to an output of each of light receiving elements in the same column and holds one of signal voltages including the signal voltage generated by the light receiving element as a current signal voltage to be AD-converted.

The AD converting unit 3 includes an AD converter per column. Each of AD converters converts the current signal voltage into the digital signal. The current signal voltage is held in the sample-hold circuit located in a corresponding column. The details of the AD converter shall be described hereinafter.

The timing generator 5 provides each of the AD converters with an instruction concerning a timing for outputting the digital signal indicating the conversion result.

The common signal line 4 is connected to each of the AD converters and transmits the digital signal outputted from the AD converter in response with the instruction from the timing generator 5.

Figure 3:
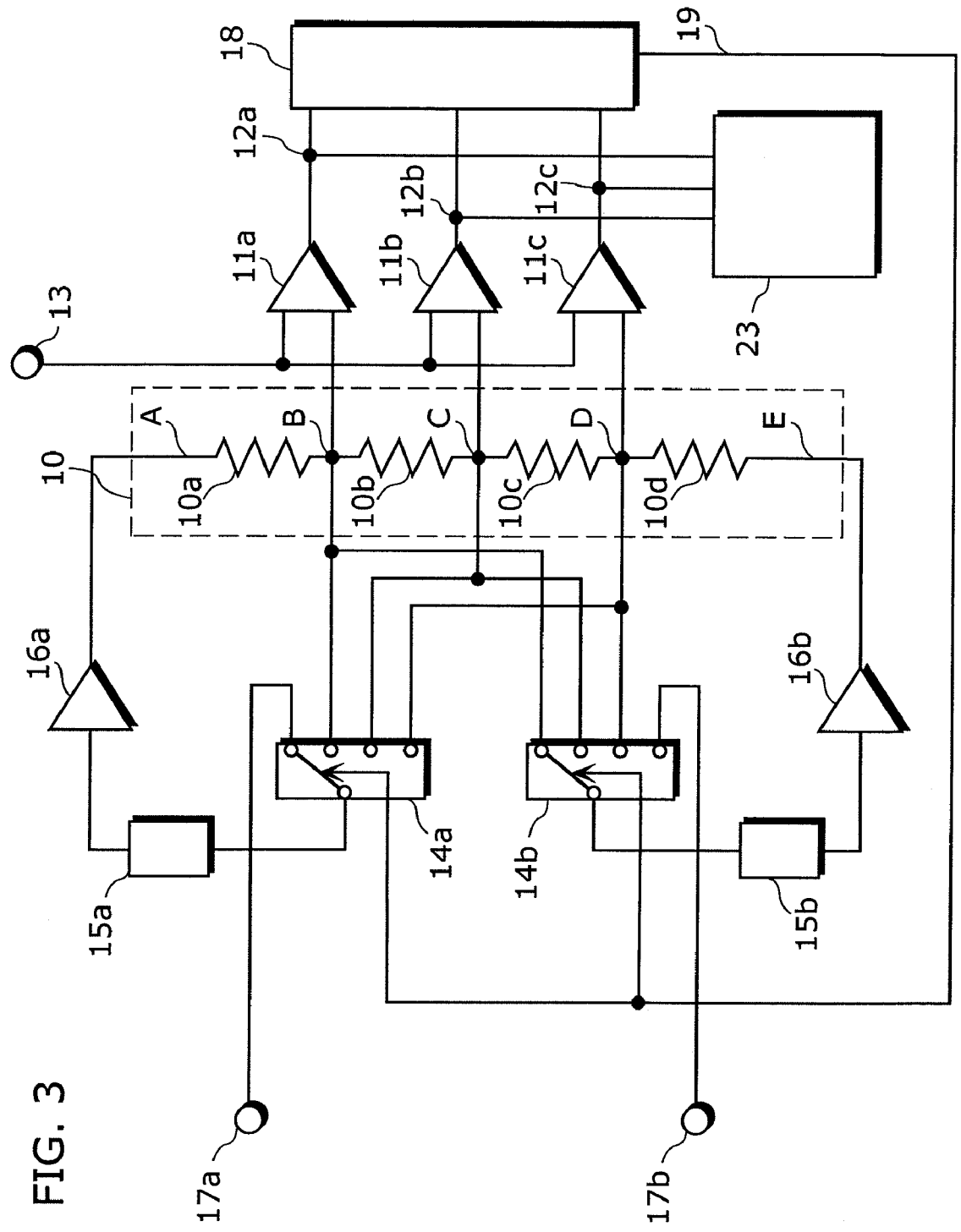
FIG. 3 is a block diagram showing one example of a functional structure of an essential part of an AD converter.

The external output line 6 outputs the digital signal transmitted via the common signal line 4 out of the solid-state imaging device. FIG. 3 is a block diagram showing one example of a functional structure of an essential part of one of the AD converters included in the AD converting unit. The essential part of this AD converter shall be described in reference with FIG. 3, followed by further explanations with FIGS. 4 and 5.

Basically, this AD converter has a structure of a flash-type AD converter, that is, the digital signal corresponding to the current signal voltage is obtained by comparing in parallel the current signal voltage with reference voltages. Furthermore, the AD converter is structured to set a voltage range for a successive comparison based on the result of the comparison, and then continue the successive comparison with new reference voltages included in the set voltage range.

Connected in series, resistances 10a to 10d structure a voltage divider to be a reference voltage generator 10. When voltages at both ends of a comparison range are applied to both ends of the reference voltage generator 10 via a sample-hold amplifier 16a and a sample-hold amplifier 16b, five reference voltages, including the applied voltages, are generated in a diminishing order from a point A to a point B.

Each of comparators 11a, 11b, and 11c has: first ends of input terminals on the comparators 11a, 11b, and 11c connected to the point B, point C and point D in the reference voltage generator 10, respectively; and second ends of the input terminals on the comparators 11a to 11c connected to a terminal 13. The current signal voltage held in one of the sample-hold circuits in the holding unit 2 (See FIG. 2) is applied to the terminal 13. Each of the comparators 11a, 12b and 11c respectively outputs comparison result signals 12a, 12b, and 12c.

A digital signal generating circuit 23: generates a digital signal showing the comparison result in binary digit out of the comparison result signals 12a to 12c; and holds a latch circuit therein. The digital signal generating circuit 23 outputs the held digital signal to the common channel signal line 4.

A selection signal generating circuit 18 generates a selection signal 19 based on the comparison result signals 12a to 12c and outputs the selection signal 19 to a selector 14a and a selector 14b.

In the selector 14a a connection is established between one of a terminal 17a, the point B, the point C, and the point D which responds to the selection signal 19 and one end of a switch 15a.

In the selector 14b a connection is established between one of the point B, the point C, the point D, and a terminal 17b which responds to the selection signal 19 and one end of a switch 15b.

Turned on and off by a controlling signal which is not illustrated, the switch 15a applies a voltage at a connected point via the selector 14a to the input terminal of the sample-hold amplifier 16a.

Turned on and off by a controlling signal which is not illustrated, the switch 15b applies a voltage at a connected point via the selector 14b to the input terminal of the sample-hold amplifier 16b.

Thanks to a high-input impedance, the sample-hold amplifier 16a and the sample-hold amplifier 16b hold the respective voltages after the switch 15a and the switch 15b are turned off, the respective voltages which are applied via the switch 15a and the switch 15b, using a minimal capacity such as a stray capacity on the respective input sides of the sample-hold amplifier 16a and the sample-hold amplifier 16b. The sample-hold amplifier 16a and the sample-hold amplifier 16b apply the held voltages to the both ends of the reference voltage generator 10 (the point A and the point B).

Figure 4:
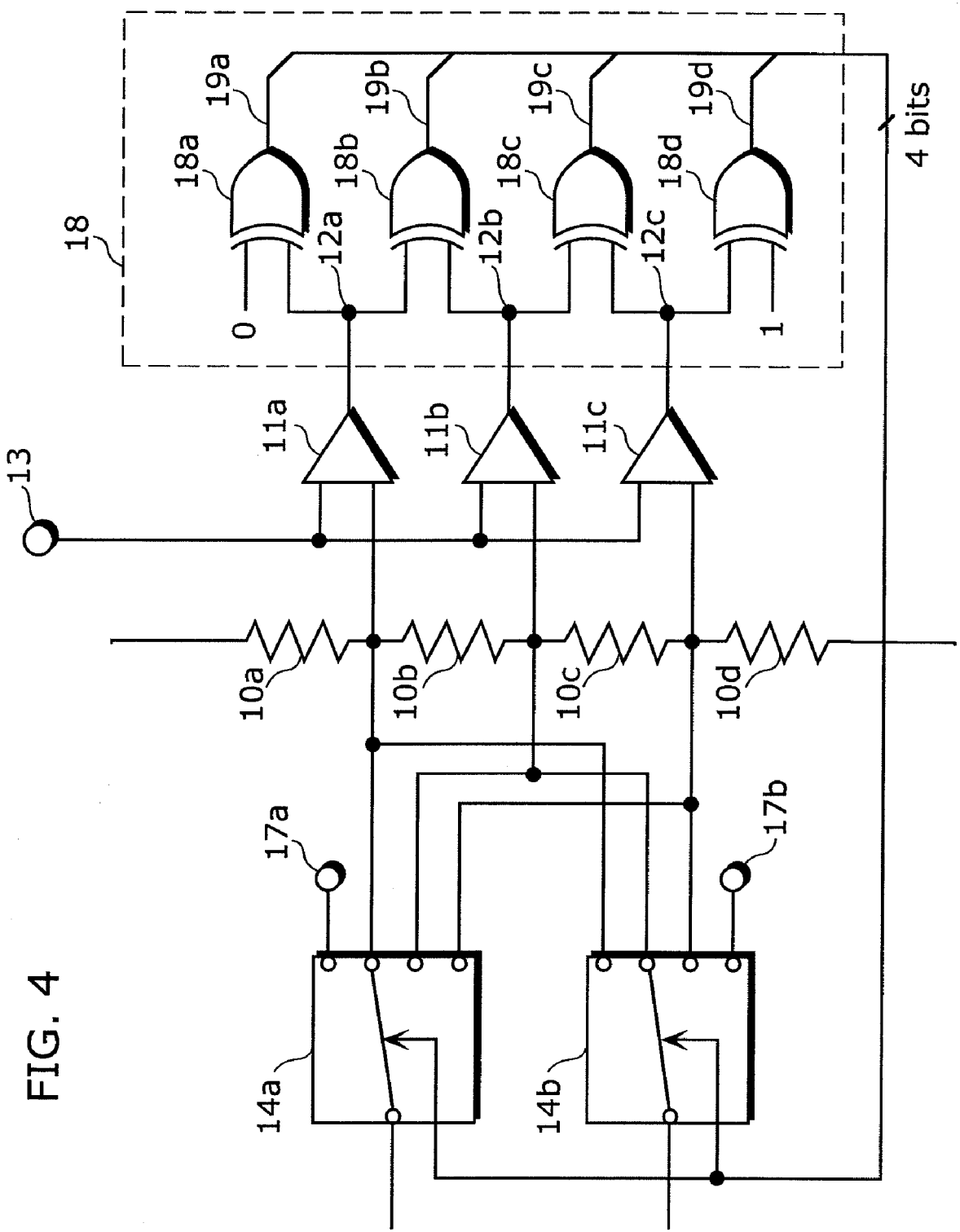
FIG. 4 is a diagram showing one example of a detailed structure of a selection signal generating circuit and a selection signal.

FIG. 4 is a diagram showing one example of a detailed structure of the selection signal generating circuit 18 and the selection signal 19. The same structural elements shown in the FIG. 3 share the same numerical reference numbers, thus the description shall be omitted. In FIG. 4, moreover, part of the circuit shown in FIG. 3 is omitted.

An exclusive circuit (XOR circuit, hereinafter) 18a outputs a selection signal 19a indicating an exclusive OR (XOR, hereinafter) of a fixed logical value 0 and the comparison result signal 12a. When having a logical value 1, the selection signal 19a shows that the current signal voltage applied to the terminal 13 is located between both ends of the resistance 10a.

An XOR circuit 18b outputs a selection signal 19b indicating an XOR of the comparison result signal 12a and the comparison result signal 12b. When having the logical value 1, the selection signal 19b shows that the current signal voltage applied to the terminal 13 is located between both ends of the resistance 10b.

An XOR circuit 18c outputs a selection signal 19c indicating an XOR of the comparison result signal 12b and the comparison result signal 12c. When having the logical value 1, the selection signal 19c shows that the current signal voltage applied to the terminal 13 is located between both ends of the resistance 10c.

An XOR circuit 18d outputs a selection signal 19d indicating an XOR of the comparison result signal 12c and the fixed logical value 1. When having the logical value 1, the selection signal 19d shows that the current signal voltage applied to the terminal 13 is located between both ends of the resistance 10d.

Note that one of the selection signals 19a to 19d has the logical value 1 and the others the logical value 0.

When the selection signal 19a has the logical value 1, in the selectors 14a and 14b, respective connections are established between the terminals on the left and the terminals located on the highest position of the four terminals on the right.

When the selection signal 19b has the logical value 1, in the selectors 14a and 14b, respective connections are established between the terminals on the left and the terminals located on the second highest position of the four terminals on the right.

When the selection signal 19c has the logical value 1, in the selectors 14a and 14b, respective connections are established between the terminals on the left and the terminals located on the third position from the top of the four terminals on the right.

When the selection signal 19d has the logical value 1, in the selectors 14a and 14b, respective connections are established between the terminals on the left and the terminals located on the lowest position of the four terminals on the right.

Figure 5:
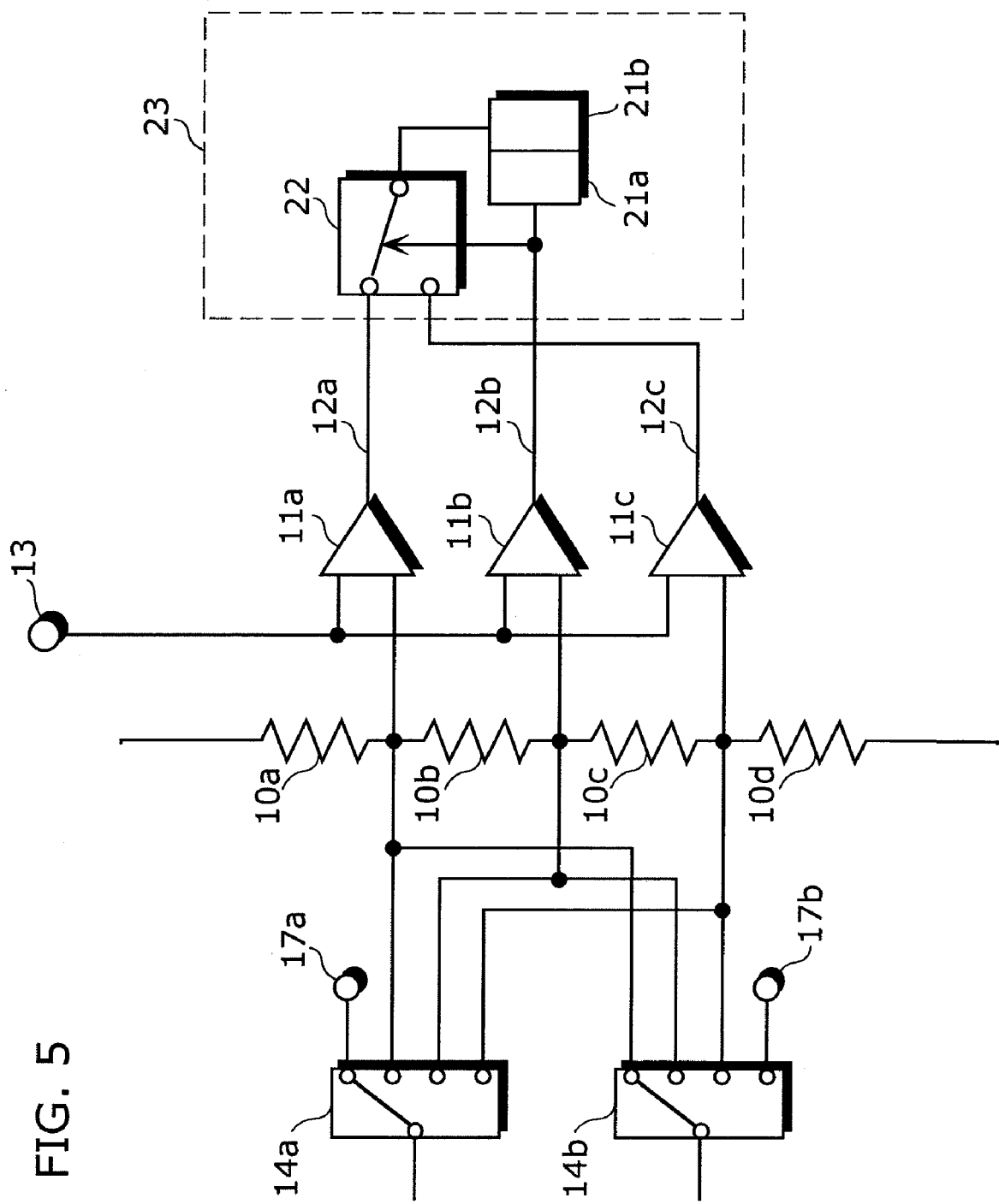
FIG. 5 is a diagram showing one example of a detailed structure of a digital signal generating circuit.

FIG. 5 is one example of a detailed structure of the digital signal generating circuit 23 generating the digital signal, showing the comparison result in binary digit, out of the comparison result signals 12a to 12c. The same structural elements shown in the FIG. 3 share the same numerical reference numbers, thus the description shall be omitted. In FIG. 5, moreover, part of the circuit shown in FIG. 3 is omitted.

A latch circuit 21a latches the comparison result signal 12b. When the comparison result signal 12b has the logical value 1, a selector 22 connects the output terminal of the comparator 11a and the input terminal of a latch circuit 21b. This allows the latch circuit 21b to latch the comparison result signal 12a.

When the comparison result signal 12b has the logical value 0, in the selector 22 a connection is established between the output terminal of the comparator 11c and the input terminal of a latch circuit 21b. This allows the latch circuit 21b to latch the comparison result signal 12c.

Figure 6:
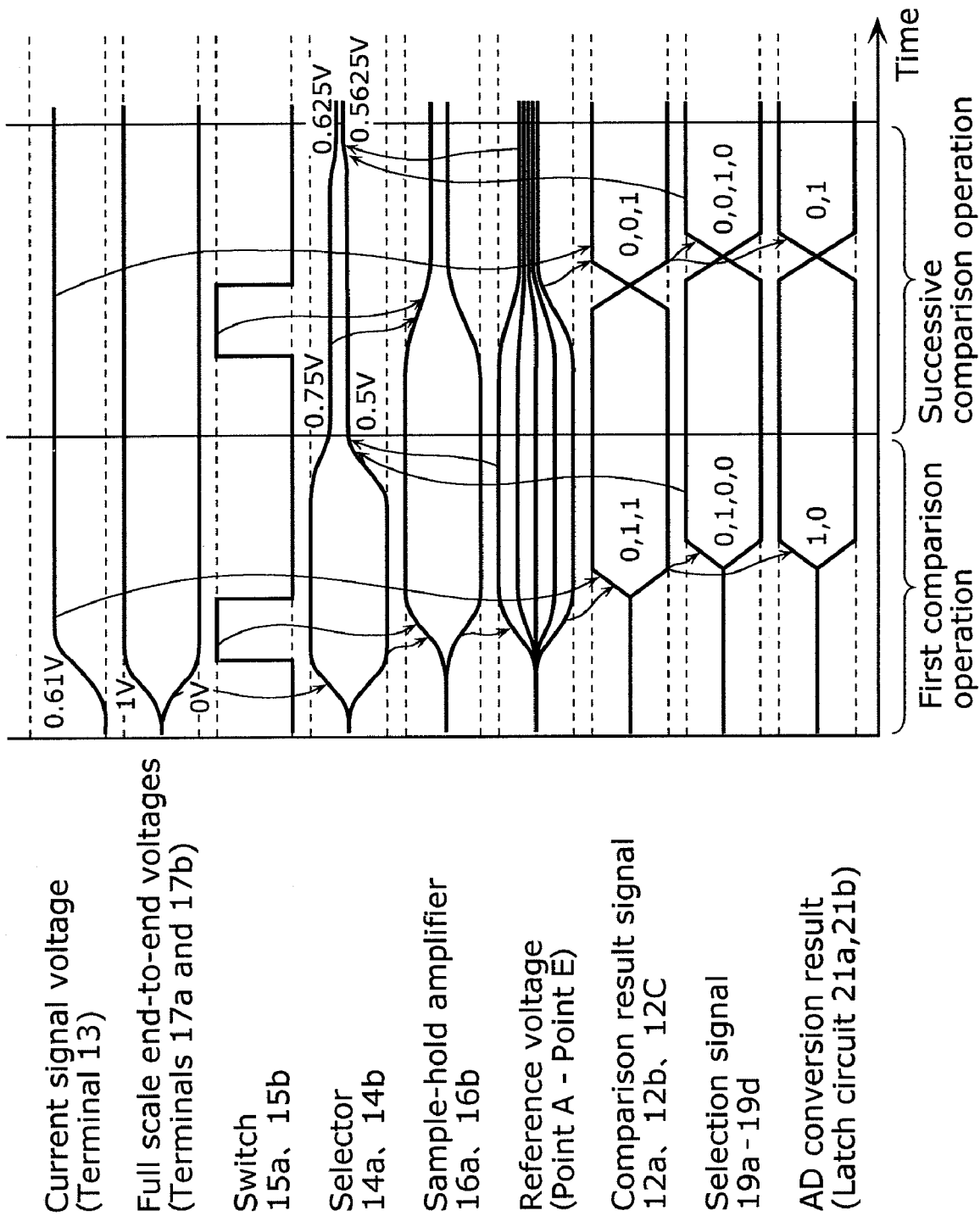
FIG. 6 is a timing chart showing one example of operations of the AD converter.

FIG. 6 is a timing chart showing one example of operations in the AD converter. In the timing chart of FIG. 6, the horizontal axis is a time scale showing a timing of an essential signal for the operations in the AD converter.

Detailed operations of the AD converter in the AD converting unit 3 shall be described with a concrete example with reference to FIG. 6, as well as FIGS. 3 and 5 hereinafter. Note that each of the operations described herewith works together under a control by an external controlling circuit (sequencer) which is not illustrated.

The FIG. 6 exemplifies that full scale end-to-end voltages (voltages to be applied to the terminal 17a and the terminal 17b as a first comparison range) are 1 volt and 0 volt, respectively, and the current signal voltage to be applied to the terminal 13 is 0.6 volts.

First comparison operation is performed as follows. One volt and 0 volt are applied to the terminals 17a and 17b, respectively, out of the AD converting unit 3.

Then, in the selectors 14a and 14b, connections are established to the highest position and the lowest position, respectively. Only in the first comparison operation are these connections in the selectors 14a and 14b mandatorily established independently from the selection signal 19 in order to set the full scale end-to-end voltages.

Turning the switches 15a and 15b on and then off, the sample-hold amplifiers 16a and 16b respectively hold the 1 volt and the 0 volt. As a result, the sample-hold amplifier 16a applies the 1 volt to the point A, and the sample-hold amplifier 16b applies the 0 volt to the point E.

In the case where all resistance values of the resistances 10a through 10d are equal, a reference voltage having 0.75 volts is generated at the point B, a reference voltage having 0.5 volts at the point C, and a reference voltage having 0.25 volts at the point D. Here, in addition to these voltages, the 1 volt obtained at the point A and the 0 volt obtained at the point E may also be considered as the reference voltages generated by the reference voltage generator 10.

The comparators 11a through 11c performs comparison, thus the comparison result signals 12a, 12b, and 12c, show "0", "1", and "1", respectively. These comparison result signals 12a through 12c show the fact that the current signal voltage is included in the neighboring reference voltages between the point B having 0.75 volts and the point C having 0.5 volts.

The latch circuit 21a holds the comparison result signal 12b "1". Since the comparison result signal 12b is "1", the selector 22 is switched to the upper position, and the latch circuit 21b holds the comparison result signal 12a "0". Then, a digital signal 10 is outputted.

Since the selection signals 19a through 19d from the XOR circuits 18a through 18d are "0", "1", "0", and "0" respectively, the connections in both of the selectors 14a and 14b are established to the second highest position, accordingly. As a result, the selector 14a outputs a voltage having 0.75 volts at the point B to the switch 15a, and the selector 14b outputs a voltage having 0.5 volts at the point C to the switch 15b.

A successive comparison operation is performed as follows. The switches 15a and 15b are again turned on and then off. As a result, the sample-hold amplifier 16a applies the voltage having 0.75 volts to the point A, and the sample-hold amplifier 16b applies the voltage having 0.5 volts to the point E. The reference voltage generator 10 generates new reference voltages; namely, 0.6872 volts at the point B, 0.625 volts at the point C, and 0.5625 volts at the point D. Here, in addition to these voltages, the reference voltage having 0.75 volts obtained at the point A and the reference voltage having 0.5 volts obtained at the point E may also be considered as new reference voltages generated by the reference voltage generator 10.

The comparators 11a through 11c again perform comparison, and then, the comparison result signal 12a through 12c show "0", "0", and "1", respectively. These comparison result signals 12a through 12c indicate the fact that the current signal voltage is included in the new neighboring reference voltages between the point C having 0.625 volts and the point D having 0.5625 volts.

The latch circuit 21a holds the comparison result signal 12b "0". Since the comparison result signal 12b is "0", the selector 22 is switched to the lower position, and the latch circuit 21b holds the comparison result signal 12a "1". As a result, the digital signal "01" is outputted.

As mentioned above, the second comparison operation performed on the narrowed comparison range allows a digital signal "1001" to be obtained.

Since the selection signals 19a through 19d from the XOR circuits 18a through 18d are "0", "0", "1", and "0" respectively, the connections in both of the selectors 14a and 14b are established to the third position from the top. As a result, the selector 14a outputs the reference voltage having 0.625 at the point C to the switch 15a, and the selector 14b outputs the reference voltage having 0.5625 volts at the point D to the switch 15b.

Continuation of another successive comparison as mentioned above allows a high resolution digital signal with a larger bit numbers to be obtained.

In the circuit illustrated in FIGS. 3 through 5, a two-bit digital signal is obtained by plural comparisons covering one comparison range. That is, comparing six comparison ranges (in other words, performing a six-stage comparison) while the comparison range being narrowed, a 12-bit digital signal can be obtained. Thus, a digital output having a higher resolution can be obtained with additional repetitions of comparison counts.

Furthermore, with additional comparators, XOR circuits, resistances, switches, and latch circuits, a three-bit converter to obtain a three-bit digital signal by the comparison per comparison range allows a 12-bit digital output to be obtained through a four-stage comparison. Moreover, a four-bit converter to obtain a four-bit digital signal per comparison range allows a 12-bit digital output to be obtained through a three-stage comparison.

Note that the present embodiment intends to obtain the 12-bit digital output, repeating the four-bit conversion three times; however, the four-bit converter and the three-time repetition are not limited to the above. Utilizing a converter which has a larger bit numbers and performing more repetitions allow a digital output having a larger bit numbers to be obtained, without changing a basic structure of the present invention.

Second Embodiment

A solid-state imaging device in a second embodiment of the present invention shall be described with reference to FIGS. 7 and 8.

Figure 7:
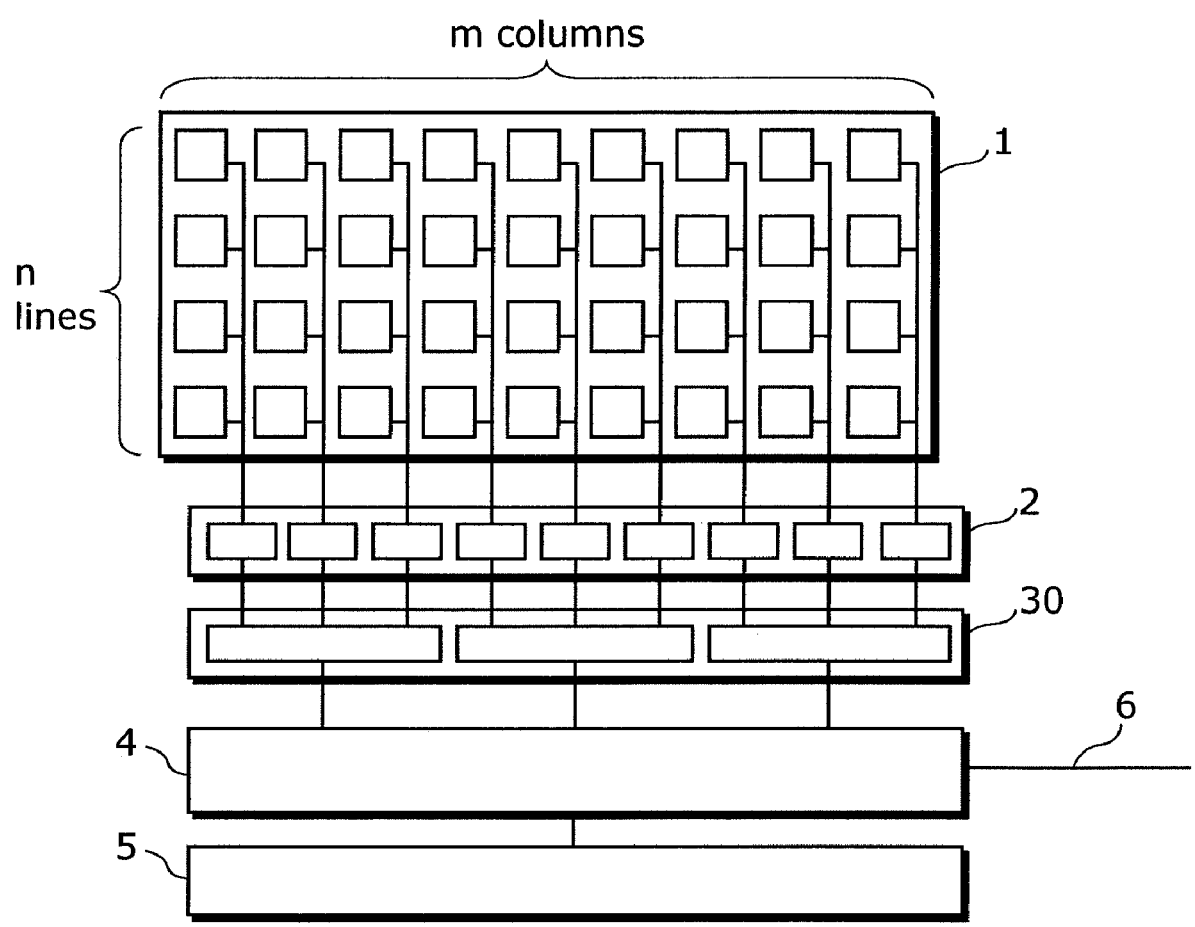
FIG. 7 is a block diagram showing one example of a functional structure of a solid-state imaging device in a second embodiment.

FIG. 7 is a block diagram showing one example of a functional structure of the solid-state imaging device in the second embodiment.

The solid-state imaging device illustrated in the FIG. 7 is implemented by replacing the AD converting unit 3 in the solid-state imaging device of the first embodiment (See FIG. 2) with an AD converting unit 30. In the AD converting unit 3, the AD converters are provided in each of columns; meanwhile, in the AD converting unit 30, each of AD converters is provided across the columns (three columns per AD converter in the example of FIG. 7).

Figure 8:
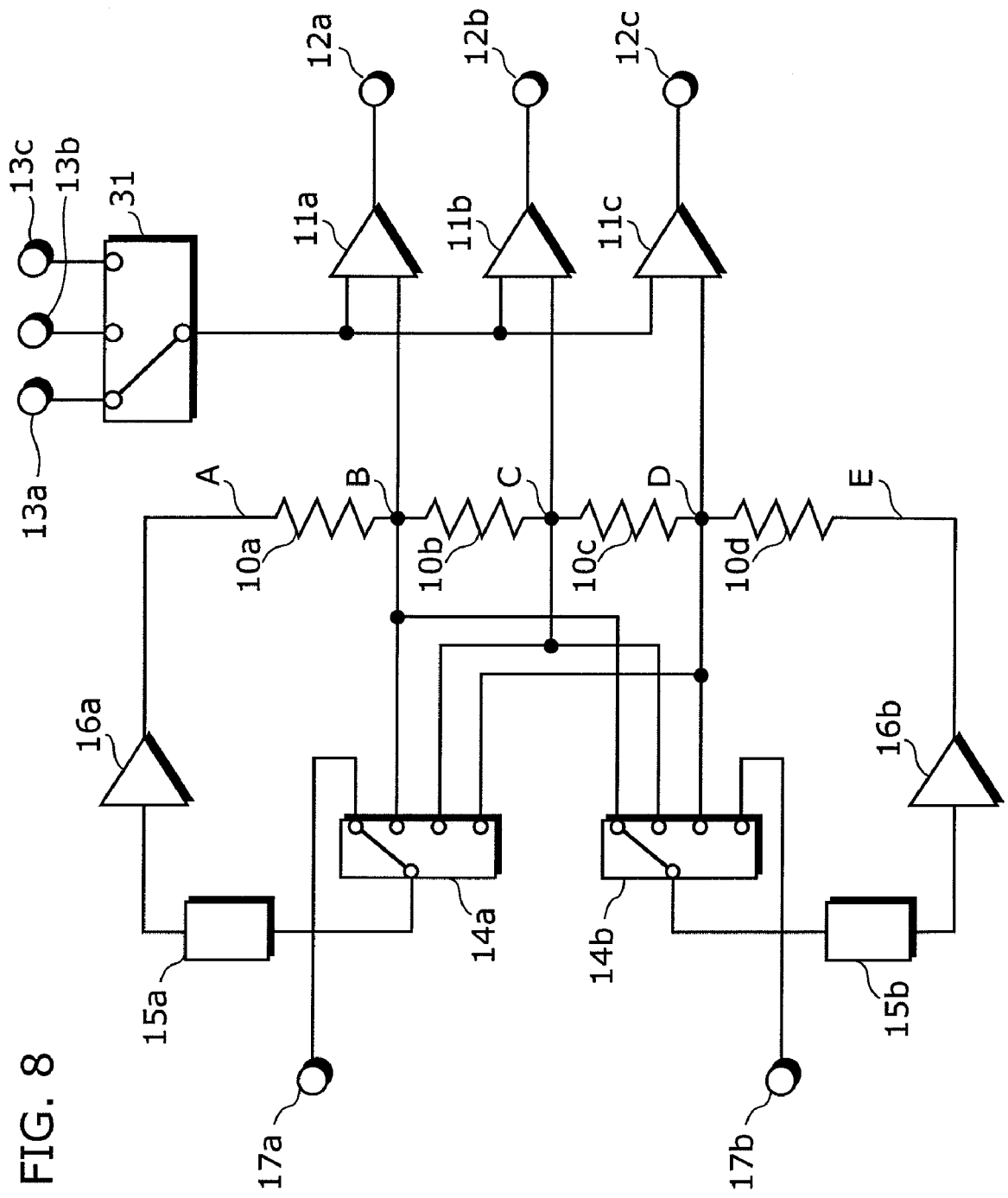
FIG. 8 is a block diagram showing a functional structure of an essential part of an AD converter.

FIG. 8 is a block diagram showing one example of a functional structure of an essential part of one of the AD converters in the AD converting unit 30. In FIG. 8, a description of a circuit for switching respective connection destinations of the selectors 14a and 14b shall be omitted.

Compared with the AD converter in the AD converting unit 3 (See FIG. 3), the AD converter shown in the FIG. 8 is different in that: the terminals 13a, 13b, and 13c are included; each of current signal voltages held in the three sample-hold circuits in the holding unit 2 (See FIG. 2) is applied to the terminals 13a, 13b, and 13c, respectively; and a selector 31 is included for selecting one of the current signal voltages applied to the terminals 13a, 13b, and 13c.

Detailed operations of the AD converter in the AD converting unit 30 shall be described with a concrete example hereinafter. Note that each of the operations described herewith works together under a control by an external controlling circuit (sequencer) which is not illustrated as described in the first embodiment.

The current signal voltages from light receiving elements provided in three columns in the pixel unit 1 are held in the three sample-hold circuits in the holding unit 2, and then applied to the terminals 13a, 13b, and 13c.

First, a connection is established to the terminal 13a in the selector 31, and then, the same operations described in the first embodiment are performed on this AD converter. Thus, a digital signal is obtained with regard to the current signal voltage applied to the terminal 13a.

Next, a connection is established to the terminal 13b in the selector 31, and then, the same operations described in the first embodiment are performed on this AD converter. Thus, a digital signal is obtained with regard to the current signal voltage applied to the terminal 13b.

Furthermore, a connection is established to the terminal 13c in the selector 31, and then, the same operations described in the first embodiment are performed on this AD converter. Thus, a digital signal is obtained with regard to the current signal voltage applied to the terminal 13c.

Since sharing one AD converter for plural columns, this structure allows one AD converter to be provided over an area having the width of the plural columns to be shared. This increases the possibility that the AD converter can be provided in a narrow column.

Third Embodiment

A solid-state imaging device in a third embodiment of the present invention shall be described with reference to FIGS. 9 and 10.

Figure 9:
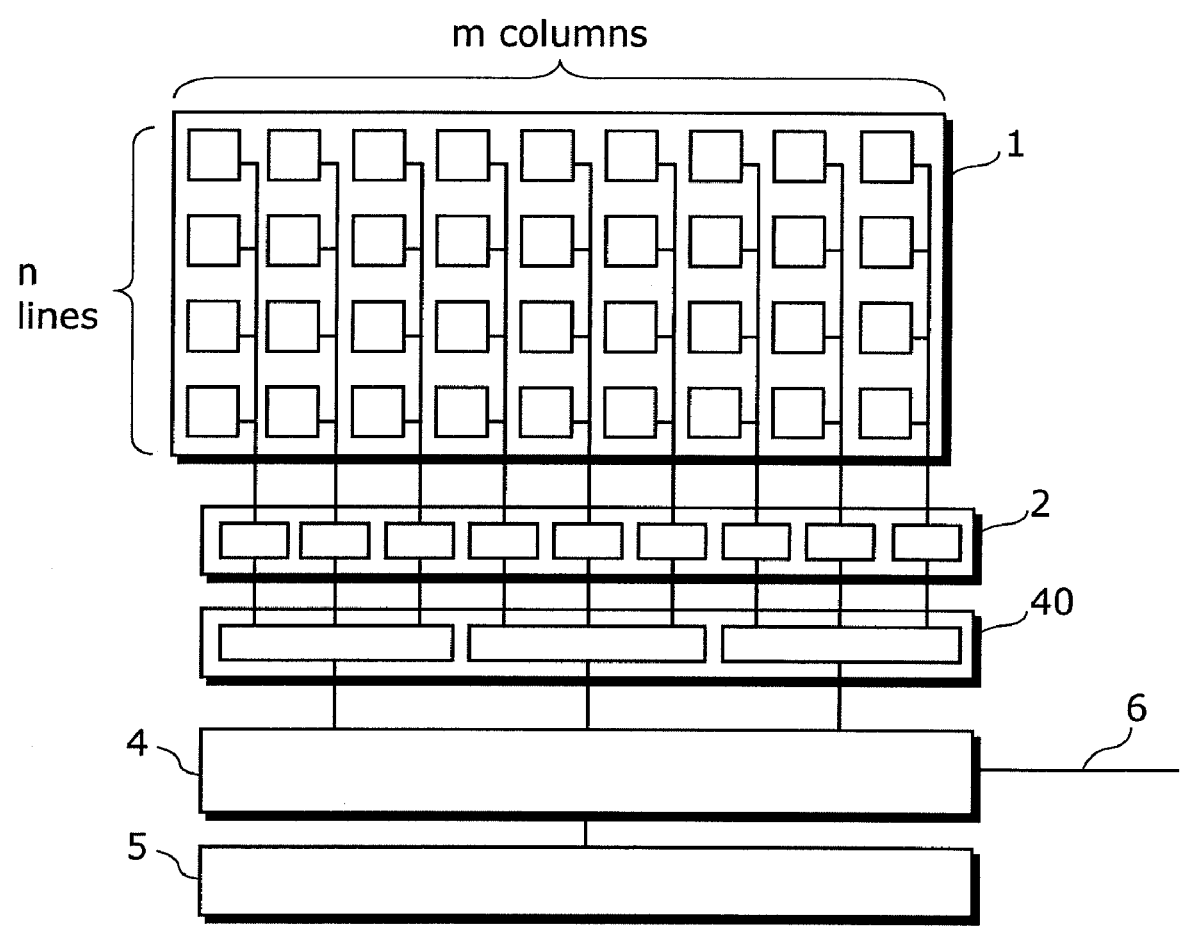
FIG. 9 is a block diagram showing one example of a functional structure of a solid-state imaging device in a third embodiment.

FIG. 9 is a block diagram showing one example of a functional structure of the solid-state imaging device in the third embodiment.

The solid-state imaging device illustrated in the FIG. 9 is implemented by replacing the AD converting unit 30 in the solid-state imaging device of the second embodiment (See FIG. 7) with an AD converting unit 40.

The AD converter in the aforementioned AD converting unit 30 (See FIG. 8) obtains the digital signal with high resolution through sequential processing, repeatedly using the reference voltage generator 10 including the resistances 10a through 10d and the comparators 11a through 11c.

In the case of an AD converter in an AD converting unit 40, meanwhile, processing covering one comparison range is assumed to be one stage. Here, one reference voltage generator and plural comparators are provided per stage. Thus, a digital signal with high resolution is obtained through multistage processing, using the reference voltage generator and the plural comparators in each stages.

Figure 10:
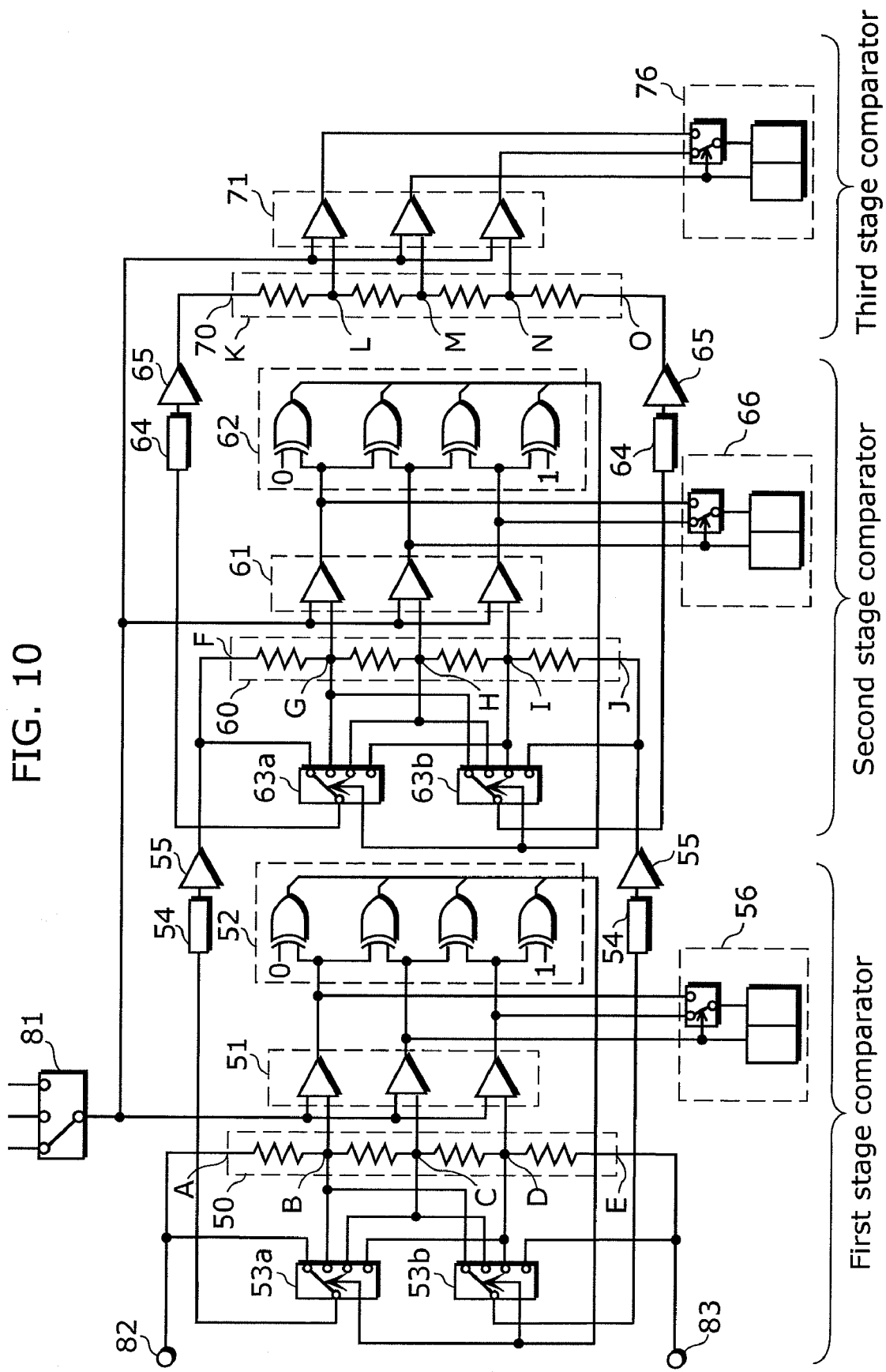
FIG. 10 is a block diagram showing one example of a functional structure of an essential part of an AD converter.

FIG. 10 is a block diagram showing one example of a functional structure of an essential part of the AD converter, in the AD converting unit 40.

This AD converter has per stage the same structure as the AD converter of the first embodiment and the AD converter of the second embodiment has, the stage which is a unit of processing covering one comparison range (a first stage comparator, a second stage comparator, and a third stage comparator in FIG. 10).

The first stage comparator includes a reference voltage generator (a group of resistances) 50, a group of comparators 51, a selection signal generating circuit (a group of XOR circuits) 52, a selector 53a, a selector 53b, switches 54, sample-hold amplifiers 55, and a digital signal generating circuit 56.

The second stage comparator includes a reference voltage generator (a group of resistances) 60, a group of comparators 61, a selection signal generating circuit (a group of XOR circuits) 62, a selector 63a, a selector 63b, switches 64, sample-hold amplifiers 65, and a digital signal generating circuit 66.

The third stage comparator includes a reference voltage generator (a group of resistances) 70, a group of comparators 71, and a digital signal generating circuit 76.

Voltages selected at the selectors 53a and 53b in the first stage comparator are respectively applied to a point F and a point J across the reference voltage generator 60 in the second stage comparator through each of sample hold-amplifiers 55.

Voltages selected at the selectors 63a and 63b in the second stage comparator are respectively applied to a point K and a point O across the reference voltage generator 70 in the third stage comparator through each of sample hold-amplifiers 65.

The selector 81 selects one of the current signal voltages held in the three sample-hold circuits in the holding unit 2 (See FIG. 2).

Terminals 82 and 83 are for applying respective full scale end-to-end voltages (a first comparison range) out of the AD converting unit 40.

The first stage comparator and the second stage comparator perform the same operations as the AD converters in the first embodiment and the second embodiment do except the point that the first stage comparator and the second stage comparator apply the selected voltages, as respective comparison ranges in succeeding comparison processing, to respective reference voltage generators in a succeeding stage instead of applying to their own reference voltage generators.

Detailed operations of the AD converter in the AD converting unit 40 shall be described with a concrete example hereinafter. Note that each of the operations described herewith works together under a control by an external controlling circuit (sequencer) which is not illustrated as described in the first embodiment.

In this example, the full scale end-to-end voltages (voltages applied to the terminals 82 and 83 as the first comparison range) are assumed to be 1 volt and 0 volt, and the current signal voltage selected in the selector 81 is assumed to be 0.61 volts.

Comparison operations in the first stage comparator are performed as follows. One volt and 0 volt are applied to the terminals 82 and 83, respectively, out of the AD converting unit 40.

Then, in the selector 53a and 53b, the connections are established to the highest position and the lowest position, respectively. Only in the first comparison operation are these connections in the selectors 53a and 53b mandatorily established independently from a selection signal from the selection signal generating circuit 52 in order to set the full scale end-to-end voltages.

At the beginning, the switches 54 are in the off-state. As a result of the comparison processing by the group of comparators 51, a latch circuit in the digital signal generating circuit 56 latches a digital signal "10" as performed in the first embodiment. Moreover, in accordance with the selection signal from the selection signal generating circuit 52, the selectors 53a and 53b select reference voltages having 0.65 volts at a point B and 0.5 volts at a point C, respectively.

Comparison operations in the second stage comparator are performed as follows. Turning the switches 54 on and then off applies the 0.65 bolts and the 0.5 bolts to a point F and a point J, respectively, of the reference voltage generator 60 in the second stage comparator. This allows the reference voltage generator 60 to generate new reference voltages: a reference voltage having 0.6872 volts at a point G; a reference voltage having 0.625 volts at a point H; and a reference voltage having 0.5625 volts at a point I.

The group of comparators 61 performs in parallel voltage comparisons on the current signal voltage having 0.61 volts, and the voltages at the points G, H, and I in the reference voltage generator 60. At this moment, the switches 64 are in the off-state.

As a result of the comparison processing by the group of comparators 61, a latch circuit in the digital signal generating circuit 66 latches a digital signal "01" as performed in the first embodiment. Moreover, in accordance with a selection signal from the selection signal generating circuit 62, the selectors 63a and 63b select reference voltages having 0.625 volts at the point H and 0.5625 volts at the point I, respectively.

Comparison operations in the third comparator are performed as follows. Turning the switch 64 on and then off applies the 0.625 volts and the 0.5625 volts to the point K and the point O, respectively, in the reference voltage generator 70. This allows the reference voltage generator 70 to generate new reference voltages: a reference voltage having 0.609375 volts at a point L; a reference voltage having 0.59375 volts at a point M; and a reference voltage having 0.578125 volts at a point N.

The group of comparators 71 performs in parallel voltage comparisons on the current signal voltage having 0.61 volts, and the voltages at the points L, M, and N in the reference voltage generator 70. Since all of outputs from the comparators included in the group of comparators 71 show "1", a latch circuit in the digital signal generating circuit 76 latches a digital signal "11".

As a result of the above AD conversion operations, a digital signal "100111" latched by the digital signal generating circuit 56, the digital signal generating circuit 66, and the digital signal generating circuit 76 is obtained.

This structure allows a digital signal having high resolution to be obtained easily and quickly by turning the switch 54 on and then off and the switch 64 on and off after setting the full scale end-to-end voltages at the terminals 82 and 83.

Note that controlling the switches 54 and 64 is effective for synchronizing the comparison operations in each stage; however, controlling the AD converter is not mandatory. As an alternative to controlling the AD converter, for example, the comparators in each of the stages in the AD converter can be asynchronously operated by keeping the switches 54 and 64 always on-state. As a result, the digital signal having high resolution is possibly obtained in a short period of time as short as a propagation delay time throughout the circuit.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device in the present invention can be widely taken advantage of by solid-state imaging devices outputting a signal voltage obtained through photo electrical conversion into a digital signal, and variously applied to products, including digital still cameras, digital video cameras, cameras for portable digital assistances, on-vehicle cameras, street cameras, security cameras, cameras for medical use, and the like.

The solid-state imaging device in the present invention is useful since a digital output with a high degree of accuracy can be obtained in a short period of time.

What is claimed is:

1. A solid-state imaging device, comprising:
a plurality of light receiving elements provided in a matrix, each of which generates a signal voltage based on an intensity of received light; and
a plurality of AD converters, each of which is provided on a corresponding column of the matrix,
wherein each of said plurality of AD converters includes:
a reference voltage generator which generates a plurality of reference voltages;
a plurality of comparators which correspond to one column of the matrix and compare in parallel a current signal voltage with the plurality of reference voltages generated by said reference voltage generator, the current signal voltage being one of the signal voltages generated by said plurality of light receiving elements in the corresponding column of the matrix; and
an outputter which outputs a digital signal showing a result of the comparison.

2. The solid-state imaging device according to claim 1, wherein each of said plurality of AD converters further includes a selector which selects, neighboring two of the reference voltages shown, by a result of the comparison, as including the current signal voltage in between,
said plurality of comparators compare in parallel the current signal voltage with a plurality of new reference voltages included between the two reference voltages selected by said selector, and
said outputter outputs a new digital signal showing a result of a new comparison between the current signal voltage and the plurality of new reference voltages.

3. The solid-state imaging device according to claim 1, wherein said reference voltage generator generates the plurality of reference voltages included between two applied voltages when the two applied voltages are applied out of said reference voltage generator,
each of said plurality of AD converters further includes a sample-hold circuit which holds the reference voltages selected by said selector and applies the held reference voltages to said reference voltage generator, and
said reference voltage generator generates the plurality of new reference voltages included between the applied reference voltages when the reference voltages held in said sample-hold circuit are applied.

4. The solid-state imaging device according to claim 1, wherein each of said plurality of AD converters further includes:
an other reference voltage generator that generates the plurality of new reference voltages included between applied reference voltages when the reference voltages selected by said selector are applied, said other reference voltage generator being different from said reference voltage generator; and
a plurality of other comparators which compare in parallel the current signal voltage when the plurality of new reference voltages are generated by said other reference voltage generator, said plurality of other comparators being different from said comparators.

5. A solid-state imaging device, comprising:
a plurality of light receiving elements provided in a matrix, each of which generates a signal voltage based on an intensity of received light; and
a plurality of AD converters, each of which is provided on a corresponding column of the matrix,
wherein each of said plurality of AD converters includes:
a reference voltage generator which generates a plurality of reference voltages;
a plurality of comparators which compare in parallel a current signal voltage with the plurality of reference voltages generated by said reference voltage generator, the current signal voltage being one of the signal voltages generated by said plurality of light receiving elements in the corresponding column of the matrix;
an outputter which outputs a digital signal showing a result of the comparison; and a selector which selects, neighboring two of the reference voltages shown, by a result of the comparison, as including the current signal voltage in between, wherein said plurality of comparators compare in parallel the current signal voltage with a plurality of new reference voltages included between the two reference voltages selected by said selector, and wherein said outputter outputs a new digital signal showing a result of a new comparison between the current signal voltage and the plurality of new reference voltages.

6. The solid-state imaging device according to claim 5, wherein said reference voltage generator generates the plurality of reference voltages included between two applied voltages when the two applied voltages are applied out of said reference voltage generator, each of said plurality of AD converters further includes a sample-hold circuit which holds the reference voltages selected by said selector and applies the held reference voltages to said reference voltage generator, and said reference voltage generator generates the plurality of new reference voltages included between the applied reference voltages when the reference voltages held in said sample-hold circuit are applied.

7. The solid-state imaging device according to claim 5, wherein each of said plurality of AD converters further includes:

an other reference voltage generator that generates the plurality of new reference voltages included between applied reference voltages when the reference voltages selected by said selector are applied, said other reference voltage generator being different from said reference voltage generator; and a plurality of other comparators which compare in parallel the current signal voltage when the plurality of new reference voltages are generated by said other reference voltage generator, said plurality of other comparators being different from said comparators.

8. An AD converter, including:

a reference voltage generator which generates a plurality of reference voltages;

a plurality of comparators which compare in parallel an analog signal voltage with the plurality of reference voltages;

an outputter which outputs a digital signal showing a result of the comparison; and a selector which selects neighboring two of the reference voltages shown, by a result of the comparison, as including a current signal voltage in between, wherein said AD converter outputs a new digital signal showing a result of a new comparison, the new comparison being between the analog signal voltage and a plurality of new reference voltages by comparing in parallel the analog signal voltage with the plurality of new reference voltages included between the reference voltages selected by said selector.

9. An AD converting method executed in an electronic circuit, comprising:

generating a plurality of reference voltages;

comparing in parallel an analog signal voltage with the plurality of reference voltages;

outputting a digital signal showing a result of the comparison;

selecting neighboring two of the reference voltages shown, by a result of the comparison, as including the current signal voltage in between; and outputting a new digital signal showing a result of a new comparison, the new comparison being between the analog signal voltage and a plurality of new reference voltages by comparing in parallel the analog signal voltage with the plurality of new reference voltages included in between the reference voltages selected in said selecting.

* * * * *